United States Patent [19]
Leroux et al.

[11] Patent Number: 5,972,051
[45] Date of Patent: Oct. 26, 1999

[54] METHOD AND APPARATUS FOR REMOVING PARTICLES FROM SEMICONDUCTOR WAFER EDGES USING A PARTICLE WITHDRAWING MEANS

[75] Inventors: Pierre Leroux; Bryan D. Schmidt, both of San Antonio, Tex.

[73] Assignee: VLSI Technology, Inc, San Jose, Calif.

[21] Appl. No.: 08/357,086

[22] Filed: Dec. 15, 1994

Related U.S. Application Data

[63] Continuation of application No. 08/080,167, Jun. 17, 1993, abandoned.

[51] Int. Cl.$^6$ .................................................. H01L 21/30
[52] U.S. Cl. ........................ 29/25.01; 15/1.51; 134/1.3; 438/906

[56] References Cited

U.S. PATENT DOCUMENTS

| 2,142,039 | 12/1938 | Abrams et al. | 106/23 |
| 2,532,011 | 11/1950 | Dahlquist et al. | 154/53.5 |
| 2,607,711 | 8/1952 | Hendricks | 117/122 |
| 3,083,393 | 4/1963 | Nappi | 428/215 |
| 3,119,714 | 1/1964 | Ehrlich | 117/122 |
| 3,128,202 | 4/1964 | Schilling | 117/122 |
| 3,189,581 | 6/1965 | Hart et al. | 260/80.5 |
| 3,268,357 | 8/1966 | Hart et al. | 117/122 |
| 3,328,482 | 6/1967 | Northrup et al. | 260/825 |
| 3,527,659 | 9/1970 | Keil | 117/145 |
| 3,665,543 | 5/1972 | Nappi | 15/215 |
| 3,983,298 | 9/1976 | Hahn et al. | 428/355 |
| 4,107,811 | 8/1978 | Imsande | 15/215 |
| 4,171,397 | 10/1979 | Morrow | 428/195 |
| 4,313,988 | 2/1982 | Koshar et al. | 428/40 |
| 4,427,726 | 1/1984 | Wolfrom | 428/43 |
| 4,490,870 | 1/1985 | Taub | 15/1.5 A |
| 4,559,250 | 12/1985 | Paige | 428/40 |
| 4,599,265 | 7/1986 | Esmay | 428/355 |
| 4,645,711 | 2/1987 | Winslow et al. | 428/355 |
| 4,718,967 | 1/1988 | Irie | 156/379.6 |
| 4,762,680 | 8/1988 | Pennace et al. | 428/40 |
| 4,777,804 | 10/1988 | Bowling et al. | 62/85 |
| 4,810,574 | 3/1989 | Ahner | 428/355 |
| 4,839,206 | 6/1989 | Waldenberger | 428/40 |
| 4,917,975 | 4/1990 | De Guzman | 428/81 |
| 4,961,804 | 10/1990 | Aurichio | 156/248 |
| 4,987,286 | 1/1991 | Allen | 219/121.68 |
| 5,171,398 | 12/1992 | Miyamoto | 156/552 |

FOREIGN PATENT DOCUMENTS

| 58-21352 | 2/1983 | Japan | 29/25.01 |
| 58-60551 | 4/1983 | Japan | 29/25.01 |
| 63-34929 | 2/1988 | Japan . |  |
| 2266544 | 10/1990 | Japan . |  |
| 03266432 | 11/1991 | Japan . |  |

OTHER PUBLICATIONS

Adhesives Technology—Developments Since 1979, Ed. M. Gutcho, (1983), pp. 58–60, Noyes Data Corporation, Park Ridge, New Jersey.

Shields, J., *Adhesives Handbook,* Third Edition (1984), pp. 2–6.

Satas, D. *Handbook of Pressure–Sensitive Adhesive Technology,* Van Nostrand Reinhold Co. (1982), pp. 39–47 and 228–231.

Primary Examiner—David Graybill
Attorney, Agent, or Firm—Burns, Doane, Swecker & Mathis

[57] ABSTRACT

Discloses is an apparatus and method for cleaning the edges of semiconductor wafers by using a particle withdrawing means having pre-formed, low-tack adhesive material that removes the particles from the edges of the wafers and retains the particles thus removed.

22 Claims, 2 Drawing Sheets

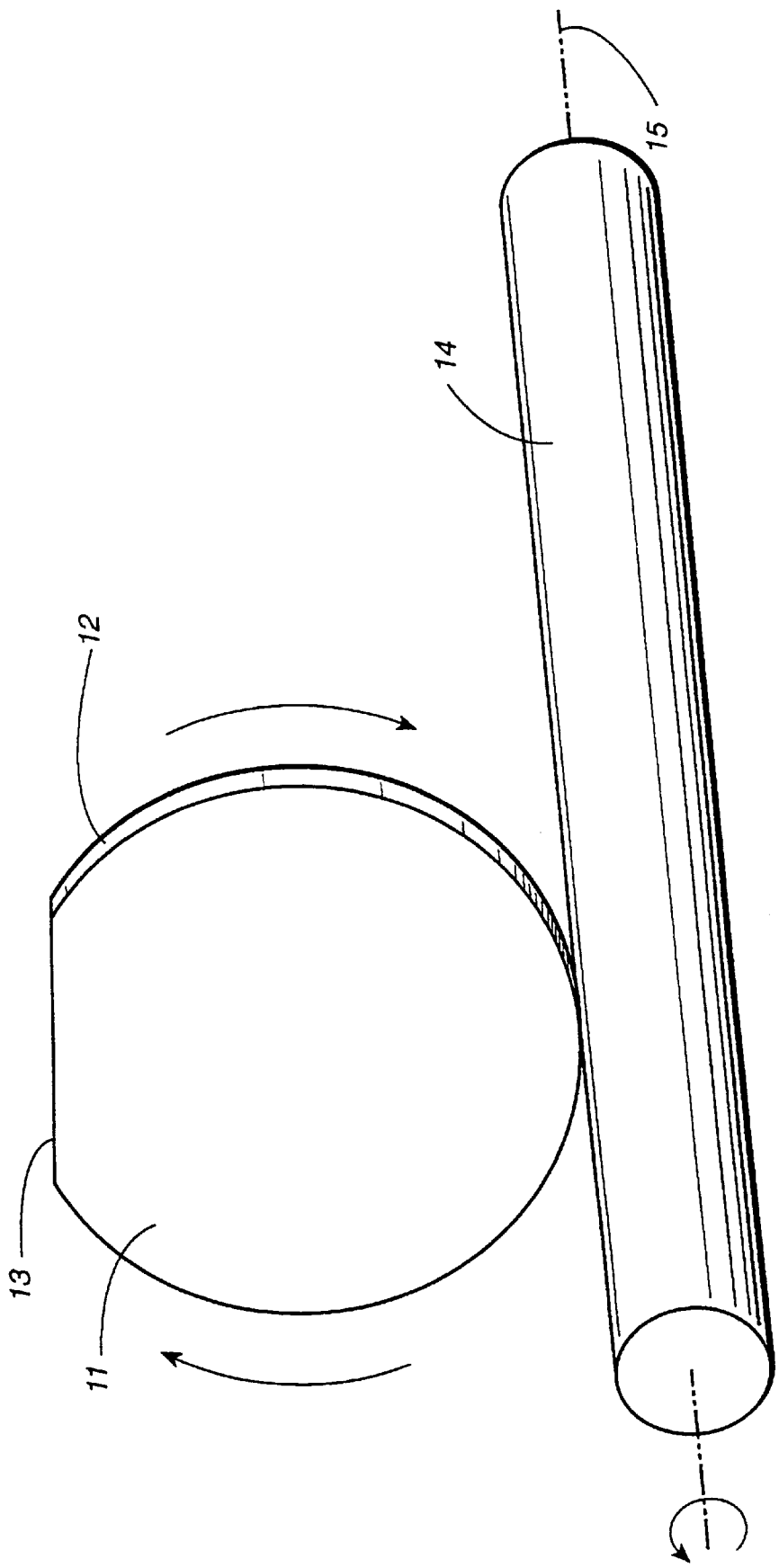
FIG._1A

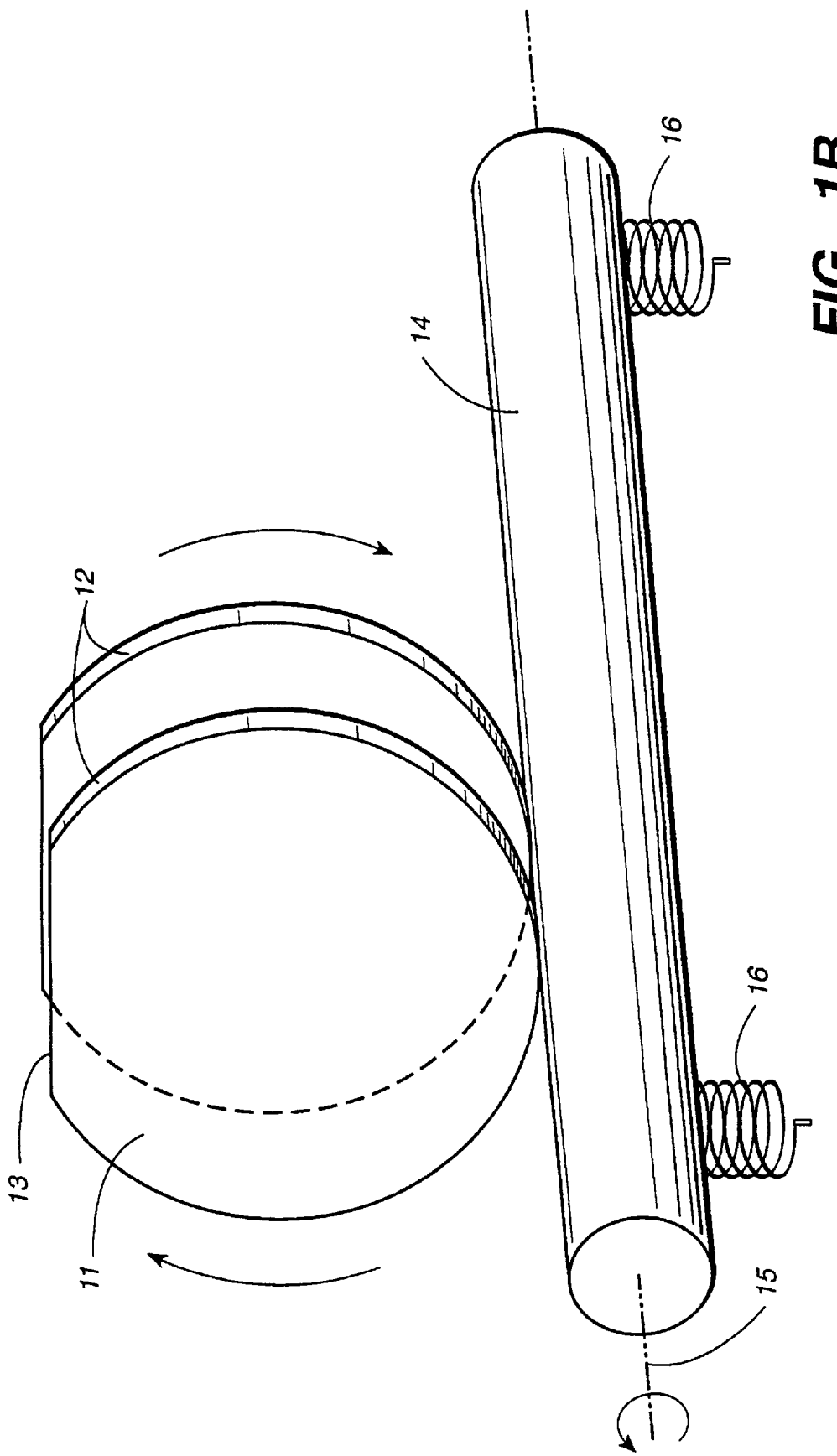
FIG._1B

METHOD AND APPARATUS FOR REMOVING PARTICLES FROM SEMICONDUCTOR WAFER EDGES USING A PARTICLE WITHDRAWING MEANS

This application is a continuation of application Ser. No. 08/080,167, filed Jun. 17, 1993 abandoned.

BACKGROUND OF THE INVENTION

1. Field of the Invention

This invention relates to an apparatus and method for removing particles from the edges of semiconductor wafers in a manner that inhibits the return of such particles to the edges of the wafers. In another embodiment, this invention relates to a method for removing particles from the edges of semiconductor wafers and retaining the particles away from the semiconductor wafer with a pre-formed, low-tack adhesive material to cause a substantially unidirectional flow of particles away from the edges of the semiconductor wafers.

2. State of the Art

In the electronics industry, particle contamination is an important factor in the manufacture of high density integrated circuits from semiconductor wafers. Even in relatively conventional technology using micron or larger circuit patterns, submicron size particle contamination can be a problem. Today the technology is progressing into the submicron pattern size, and particle contamination is even more of a problem. Contaminant particles larger than roughly 10% of the pattern size can create damage such as pinholes which interfere with fabrication processes (such as etching, deposition and the like) and defects of that size are a sufficiently significant proportion of the overall pattern size to result in rejected devices and reduced yield. As an example, it has been found that the minimum particle size which must be removed in order to achieve adequate yield in one Megabit chip (which has a pattern size of one micron) is about 0.1 microns.

Filtration (of air and liquid), particle detection, and contaminant removal are techniques which are used in current contamination control technology in order to address the problems outlined above. For example, semiconductor fabrication is often conducted in clean rooms in which the air is highly filtered, the rooms are positively pressurized, and the personnel allowed into the room are decontaminated and specially garbed before entry is allowed.

Another previously developed method of particle removal is to place the surface to be cleaned in a chemical bath and then use an ultrasonic or a megasonic sound agitating system. In this system, the ultrasonic or megasonic sound is induced into the liquid which shakes the chemical bath and attempts to remove any particles. This has been somewhat effective against relatively large particles, but ineffective against small particles.

Another cleaning method which has been previously used is to blast the surface to be cleaned with a fluid in order to blow or wash the particles from the surface. One such method utilizing water is disclosed in U.S. Pat. No. 4,027,686, to Shortes, et al. and assigned to Texas Instruments, Inc. Other fluids, including air, have been used with varying degrees of success. These methods have proven to be effective against large particles, but relatively ineffective against particles in the 0.1 micron or smaller range.

Another previously developed method involving application of force to the particle exploits the mass of the particle by the use of gravity or centrifugal force. This method requires the particle to be of sufficient size to be pulled or thrown from the surface. When the particles are very small or have little mass, the forces may not be high enough to remove them. Therefore, this method is generally ineffective against submicron sized particles.

Still another line of previous attempts to remove particles is to convert them into nonparticles. This requires a knowledge of the chemistry of the particles, or a universal solvent (one that would dissolve all particles). This method uses a chemical specifically designed to attack and dissolve the particles but not the substrate they are on. It is necessary to know what the particles to be removed are and, therefore, the appropriate chemical. Since it is unlikely that the composition of all the particles will be known, it is difficult to remove all the particles with a chemical.

Another prior method to remove particles involves particle and surface interaction. This is an attempt to make the particle and the surface repel each other through the use of electricity. The problem encountered with this method is that a high electrical charge is required and, thus, it has been found to be undesirable.

One of the most common methods of particle removal involves using a brush scrubber. In this method, a brush is used to wipe the particles from the surface. It is necessary to compromise the stiffness of the brush bristles so that they are stiff enough to remove the particles yet soft enough to not damage the surface. This method is effective against relatively large particles only and is relatively ineffective on the edges of the wafers.

A final method of removing particles has been an attempt to adhere the particles to a removable film. A polymer gel or liquid is applied to the surface in an attempt to soak up all the particles. After the polymer has dried, and hopefully drawn the particles into it, the polymer is peeled off to remove the particles. This method, as with the other methods listed above, works only with relatively large particles and doesn't address the problem of particles situated at the edges of the wafers.

As the particle size decreases the particle weight become less significant as compared to other adhesive forces binding the particle to the surface which it contaminates. Removal of such small particles can potentially damage the substrate. In general, it has been found that submicron particles are the most difficult to remove. Many of the processes developed to clean integrated circuits, such as ultrasonic agitation, are not effective for micron and submicron particles and indeed, sometimes add contaminants to the substrate.

As alluded to above, another handicap of these previously developed physical removal processes is the fact that they can damage the surface being cleaned as well as introduce other particles while trying to remove them.

Additionally, prior art methods of removing particles from semiconductor wafers have focused almost exclusively on the removal of particles from the front and back surfaces of the wafer. However, by leaving particles on the sides or edges of the semiconductor wafer, it is possible for these particles to migrate to the front or back surface of the wafer by, e.g., physical, mechanical, electromechanical or other such means, and there interfere with the processing of the wafer.

Accordingly, there is a great need for a removal technique which allows for the removal of particles from the edges of semiconductor wafers. Such a removal technique should also provide a driving force sufficient for particle removal from the edges of semiconductor wafers without any substantial harm to the substrate material. Moreover, acceptable removal techniques should provide a minimum level of cleanliness in a reliable fashion.

SUMMARY OF THE INVENTION

The present invention is directed to an apparatus for removing particles from the edges of semiconductor wafers. The apparatus comprises a particle withdrawing means contactable with the edge of at least one semiconductor wafer which removes particles from the edges of such wafer(s) and inhibits the return of the particles to the semiconductor wafer(s). The surface of the particle withdrawing means comprises a pre-formed, low-tack adhesive material. The particle withdrawing means is preferably contained in a suitable housing.

According to the invention, there is also provided a method for removing particles from the edges of semiconductor wafers. The method comprises contacting the edge of at least one semiconductor wafer with a particle withdrawing means to remove particles therefrom. The surface of the particle withdrawing means comprises a pre-formed, low-tack adhesive material that removes the particles from the semiconductor wafers in a manner that inhibits the return of the particles to the edges of the semiconductor wafers.

BRIEF DESCRIPTION OF THE DRAWINGS

FIGS. 1A and 1B depict a portion of preferred apparatus and methods according to the present invention. A detailed description thereof is as follows.

DETAILED DESCRIPTION OP THE PREFERRED EMBODIMENTS

As depicted in FIG. 1A, there is shown a portion of a preferred apparatus for removing particles from the edges of semiconductor wafers according to the present invention. In particular, there is depicted in FIG. 1A a flat align spindle 14 which constitutes the particle withdrawing means for an embodiment of this invention. At various portions during the processing of the wafers, a flat align spindle such as depicted in FIG. 1A is made to contact the semiconductor wafers 11 which have an edge 12 and a flattened portion 13 so as to orient the wafers into a predetermined orientation.

During the processing of semiconductor wafers, the edges 12 of the wafers 11 get dirty, i.e., the edges accumulate undesirable particles of various sizes and compositions. However, standard cleaning techniques are designed to clean the front and back surfaces of the wafer and do very little to clean the edges of the wafer. Apparently, this accumulation of particles on the edges of the wafer has not been recognized as being sufficiently problematic to warrant a separate cleaning step. However, the present inventors have learned that the particles remaining on the edges of the wafer after cleaning can migrate from the edges to the front or back surface of the wafer where they interfere substantially with the processing of the wafer.

For example, if the particles migrate to the front surface of the wafer prior to or during the photoprocessing of the wafer, they can create shadows on the photoresist which distort the pattern of the etch. Similarly, if the particles migrate to the back surface of the wafer prior to or during the photoprocessing of the wafer, they can raise a portion of the wafer thus causing the photoresist on the top surface of this portion of the wafer to be out of focus. Consequently, the pattern of the etch is again distorted.

As the features of very large scale integration (VLSI) circuits continue to shrink to 1 µm or less, there is an ever increasing need to clean not only the front and back surfaces of the semiconductor wafer, but also to clean the edges of the wafers so as to avoid the problems identified above. By cleaning the edges of the semiconductor wafers, the apparatus and method of the present invention significantly reduce the problems associated with contamination of the semiconductor wafers by particle migration from the edges of the wafers to the front or back surface of the wafers.

As used herein, the term "edge" or "edges" of a semiconductor wafer refer to not only the exterior circumference of the wafer but also that portion of the front and back surface of the wafer proximate the exterior circumference of the wafer from which particles are also withdrawn during the practice of the invention.

It is known in the art to use flat align spindles in order to align the wafers into a predetermined orientation. The exterior surface of these flat align spindles have been made of materials such as polytetrafluoroethylene ("Teflon"™). These flat align spindles provide a small measure of cleaning on the edges of the semiconductor wafers. However, the use of these ("Teflon"™)-coated spindles have a number of serious limitations.

First, the particle retaining capacity of these spindles is very limited. Thus, after a relatively short period of time, the spindles became covered with particles such that the spindles essentially lose their ability to remove particles from the edges of the wafers. Moreover, the force holding the particles to the spindles is so slight that the particles tended to be returned again to the edge of the same or a different semiconductor wafer. Additionally, if these spindles are to be effective in cleaning the semiconductor wafers, it is necessary to clean or replace these spindles on a frequent basis. However, due to the inconvenience of such cleaning processes and the cost of replacing these spindles, neither of the above tended to be done with the degree of frequency that a successful cleaning operation demanded. Thus, there is a significant need for an in-line cleaning process which reliably and efficiently cleans the edges of semiconductor wafers.

Consequently, the present invention seeks to remove the particles from the edges of semiconductor wafers by contacting the wafers with a particle withdrawing means which removes the particles from the wafer edges and retains the particles so that they are not returned to the edges of the wafers. For this reason, the particle withdrawing means has a particle attracting force which is greater than the force holding the particles to the edges of the semiconductor wafers. In other words, the particle attracting force of the particle withdrawing means is sufficient to remove the particles from the edges of the wafers and to inhibit the return of such particles to the wafers.

While it is possible that the attracting force of the particle withdrawing means may be mechanical, physical, chemical, magnetic or electrostatic in nature, it is preferred that the particle retaining means employ the removing force of an adhesive material. For example, the particle withdrawing means may have a surface made of, e.g., a pre-formed, low-tack adhesive.

Alternatively, the particle withdrawing means may be made of a material which is capable of using an electrostatic charge to remove particles from the edges of the semiconductor wafers. Additionally, the invention contemplates a combination of withdrawing means, e.g., a pre-formed, low-tack adhesive covering a magnetic withdrawing means or an electrostatic withdrawing means.

According to a preferred embodiment of the invention, the particle withdrawing means is essentially cylindrical in shape, e.g., the shape of a roller, cylinder, tube or spindle, and is rotatably contacted with the edge of the semiconductor wafer. For example, as depicted in FIG. 1A, the particle withdrawing means may comprise a flat align spindle 14 which is caused to roll around axis 15 in a predetermined direction. And, by contacting the wafers, the flat align spindle 14 causes the wafers to rotate until arriving at the flattened portion 13 of the wafer 11. Rotation of wafer 11 can be controlled to be in the same or opposite direction of that of spindle 14.

While the flat align spindle 14 is rotating the wafers 11, it is also simultaneously withdrawing particles from the edges 12 of the wafers 11. As a result of the pre-formed, low-tack adhesive on the surface of the flat align spindle 14, the particles withdrawn by the flat align spindle 14 remain attached to the surface thereof. The flat align spindle 14 has a sufficient attracting force not only to remove the particles from the edges 12 of the wafers 11, but also to inhibit any substantial return transfer of particles from the particle withdrawing means to the edges 12 of the wafers 11.

According to another preferred embodiment of the invention illustrated in FIG. 1B, the particle withdrawing means is made to contact the edge of the semiconductor wafers, including the flat edge 13, by, for example, springs 16 which spring load the particle withdrawing means against the wafers. By spring loading the particle withdrawing means against the wafers, it is possible to control the amount of force applied by the particle withdrawing means against the wafers.

In another embodiment, the semiconductor wafers or the particle withdrawing means, or both, are made to traverse laterally in relation to the other. In this way, it is possible to expose the edge of the wafers to a relatively clean portion of the particle withdrawing means, i.e., a portion of the particle withdrawing means that is less saturated with particles than other portions thereof. The purpose of this lateral displacement is to maximize the cleaning capacity of the particle withdrawing means by effectively utilizing the entire surface of the particle withdrawing means.

Although the particle withdrawing means may be located and/or used at any position throughout the processing of the semiconductor wafers, it is preferably rotatably connected within a wafer boat. Thus, the wafer boat comprises a preferred housing for the particle withdrawing means according to the invention. However, it will be appreciated that this preferred embodiment of the invention contemplates the use of any suitable housing.

As indicated above, it is preferred that the surface of the particle retaining means comprises a pre-formed, low-tack adhesive material. The term "pre-formed adhesive material" is intended to include any suitable low-tack adhesive material which has a predefined shape prior to contacting the semiconductor wafer. This is not to say that the adhesive has no resiliency or that it will not deform slightly under pressure. Rather, it means that the adhesive material would not, at room temperature, spontaneously take on a shape significantly different than that which it has been given in the manner that a liquid or gel might.

The term "suitable low-tack adhesive material" is intended to include any adhesive composition which has sufficient adhesive strength to effectively remove the various types and sizes of particles from the surface of the particle withdrawing means, yet not so adherent as to remain adhered to the surface of the particle withdrawing means. In simple terms, the adhesive must be strong enough to remove the particles from the semiconductor wafer but not so strong as to stick to, and remain on, the particle withdrawing means.

The pre-formed, low-tack adhesive material of the present invention is made of a substrate or backing material which is coated on at least one side with a suitable low-tack adhesive material. It is important that the adhesive material be attached to a suitable backing or substrate material so that the adhesive material remains firmly attached to the substrate material without peeling off.

Preferred backing or substrate materials to which the low-tack adhesive material may be attached include extrusion grade polyesters such as polyethylene terephthalate (which is available under the trade name "Mylar"™), cellophanes, such as ethyl cellulose, benzyl cellulose, cellulose butyrate, cellulose nitrate, etc.; and vinyl polymer films such as polyvinyl acetate, polyvinylidene chloride, polyethylene, and other modified polyethylenes. One reason that these substrate materials are preferred is that they maintain a high structural integrity even when they are in sheets having a relatively small thickness.

In a particularly preferred embodiment, the polyethylenes comprise high-density polyethylenes. The advantage of high-density polyethylenes is that they possess a high tensile strength, e.g., a film tensile strength of about 4800 p.s.i. (according to ASTM test method D882). This film tensile strength is sufficient to withstand an adhesive pull load from an underlying layer of ten ounces pull per lineal inch of width. Linear low-density polyethylene films are preferred according to another embodiment as they are able to withstand ten ounces of adhesion per inch of width without tearing as they typically possess a film tensile strength of about 6000 p.s.i. Low density polyethylene films by comparison have a typical tensile strength of about 2800 p.s.i.

In another aspect of the invention, the substrate material is made as thin as possible while maintaining sufficient structural integrity to support an adhesive material without peeling, breaking, cracking, etc. under process conditions customary to the processing of semiconductor wafers. The substrate material is made very thin so that multiple low-tack adhesive sheets may be rolled or stacked onto the particle withdrawing means. In this way, when the adhesive material approaches its particle retaining saturation point, i.e., the removing and retaining capacity has decreased significantly, the nearly saturated adhesive composite sheet may be peeled off to expose a fresh low-tack adhesive composite sheet.

Where multiple low-tack adhesive composite sheets are to be employed, the backing or substrate material should have a thickness of less than about 10 mils, and preferably less than about 1 mil. More preferably, the thickness of the backing or substrate material is less than about 0.5 mil, and most preferably less than about 0.1 mil.

For example, by using a substrate material having a thickness of about 0.4 mil and an adhesive material having a thickness of about 0.1 mil, the thickness of a composite adhesive sheet would be approximately 0.5 mil. Consequently, it would be possible to stack a series of 100 sheets of a low-tack adhesive at a thickness of only about 50 mils. Similarly, it would be possible to roll a series of 100 sheets around a spindle to produce a particle withdrawing spindle having a diameter of about 100 mils greater than the diameter of the spindle itself.

It will be appreciated, however, that films thinner than 0.4 mil can be used in a stack or roll according to the invention so long as the adhesive pull load is sufficiently low. For example, low-density polyethylene film substrate materials can successfully withstand pull loads of five ounces per lineal inch. Thus, where a pull load of less than about one ounce per lineal inch is sufficient to effectively remove particles from the edge of the wafer, the thickness of the substrate material may be less than about 0.4 mil, and even less than about 0.1 mil.

The particle withdrawing means need not, however, comprise a series of layered adhesive sheets. The particle withdrawing means may comprise only a single layer of low-tack adhesive material attached to, e.g., a roller or flat align spindle, with or without a backing material. When only a single layer of adhesive composite material is employed, the constraints on the thickness of the substrate material and the adhesive material are significantly reduced.

It is also desirable that the substrate material does not dry up and become brittle with age. Similarly, it is desirable that the substrate material exhibit good elongation, pliability and flexibility. Additionally, it is preferred that the substrate material be capable of bonding strongly to the selected low-tack adhesive material and also have the ability to releasably adhere to the confronting adhesive coating of an adjacent underlying sheet.

To cause the adhesive to adhere strongly to the surface of the substrate material, it is possible to distress the ordinarily smooth surface of the substrate. This treatment of the substrate surface is accomplished by a high electronic discharge onto the surface and is commonly called a corona treatment. Without this corona treatment the adhesive would be more apt to rub off from the substrate material and stick to the edge of the semiconductor wafer. This electronic or corona treatment of substrate films is well known and is widely used in adhesive coating operations.

As will be appreciated by those skilled in the art, a surface coating such as a primer may also be used to modify the level of adhesion between the front and back of the substrate material thus establishing a suitable surface treatment differential. For example, silicone or siloxane release coatings have been widely used to facilitate the removal of adhesive materials. See, e.g., U.S. Pat. Nos. 3,328,482; 3,527,659; 4,171,397; 4,313,988; and 4,762,680 which are incorporated herein by reference in their entirety.

The factors that are involved in selecting a suitable low-tack adhesive include the nature of the adhesive, the cohesion (internal strength) of the adhesive, the elasticity (a reactive force when stretched and retracted when released after stretching) of the adhesive, and the adhesion (tackiness) of the material. The low-tack adhesive of the invention seeks to achieve a high cohesion while maintaining suitable adhesion, stretchiness (elongation under low stresses) and elasticity, thereby resulting in an adhesive having a proper four-fold balance of adhesion, cohesion, stretchiness and elasticity. It is this four-fold balance which permits the adhesive material to be aggressively and stably tacky and yet capable of being stripped back from the edges of the semiconductor wafers without delamination or retention of the adhesive material on the edges of the wafers.

The low-tack adhesives according to the invention may be one of any number of natural or synthetic low-tack adhesives. Typically, low-tack adhesives have a stripping force no greater than about 1000 grams per inch. It is preferred according to one embodiment of the invention that the stripping force be no greater than about 500 grams per inch, and more preferably no greater than about 100 grams per inch. It is particularly preferred that the stripping force of the adhesive material be no greater than about 20 grams per inch.

Of course, it will be appreciated that whether a particular adhesive is removed or remains attached to the particle withdrawing means depends at least in part on the degree to which the adhesive material is forced against the edges of the semiconductor wafers. Accordingly, the amount of force used to apply the adhesive material against the semiconductor wafers should vary according to the strength of the particular adhesive material employed, i.e., as the tack of the adhesive material increases, the force applied by the particle withdrawing means should decrease and vice versa. In any event, the amount of force applied between the particle withdrawing means and the edge of the wafer should be sufficient to effectively remove the contaminant particles from the wafer without leaving any appreciable amount of the adhesive on the edge of the wafer.

The function of the adhesive material is to provide instantaneous adhesion and removal of the particles from the semiconductor wafers when applied under light to moderate pressure as described above. The capacity to obtain instantaneous adhesion is usually expressed as the amount of "tack" or "tackiness." It is preferred that the amount of tack according to the present invention be no greater than about 250 psi, and more preferably no greater than about 100 psi. In a particular preferred embodiment, the amount of tack is no greater than about 25 psi.

In general, low-tack adhesives, per se, are known in the art and the particular low-tack adhesive used in this invention is not critical. The present invention contemplates the use of a wide range of natural and synthetic adhesive materials which provide suitable tack and adhesiveness. In this regard, typical synthetic adhesive materials include elastomers such as synthetic rubbers and their derivatives, as well as reclaimed rubbers; thermoplastics such as cellulose derivatives, vinyl polymers and copolymers, polyesters, polyacrylates, polyethers and polysulphones; and thermosetting resins such as amino plastics, epoxides, polyesters, polyaromatics, furanes, and phenolic resins or modifications thereof. A few specific examples of the above include the following.

First, polymers and copolymers based on alkyl acrylate can provide suitable low tack adhesives. A few examples of suitable polymers and copolymers based on alkyl acrylates include the following: U.S. Pat. No. 4,599,265 which relates to an adhesive composition having a polymer with greater than one monomer of predominantly alkyl acrylate, the alkyl groups of which have an average of 8 to 12 carbon atoms; and U.S. Pat. No. 3,189,581 which relates to a pressure sensitive adhesive composition containing interpolymers of alkyl acrylates, vinyl esters, and N-alkoxyalkyl acrylamides. The disclosures of these patents are incorporated herein by reference in their entirety.

Second, suitable adhesives also include polymers and copolymers based on acrylic acid esters. For example, Reissue U.S. Pat. No. 24,906 relates to an acrylic acid ester of non-tertiary alcohol combined with a strongly polar copolymerizable monomer such as acrylic acid. Similarly, U.S. Pat. No. 3,008,850 relates an acrylic acid ester of non-tertiary alcohol combined with acrylonitrile or methylacrylonitrile. The disclosures of both of these patents are incorporated herein by reference in their entirety.

Suitable adhesives may also include polysiloxane-containing resins, e.g., those containing benzene soluble resin copolymers having $R_3SiO_{1/2}$ units and $SiO_2$ units (see, e.g., U.S. Pat. Nos. 3,983,298; 2,736,721; 2,814,601; 2,857,356; 3,528,940; and British Patent Specification No. 998,232 which are incorporated herein by reference in their entirety).

Other suitable adhesives include, for example, those disclosed in U.S. Pat. No. 4,645,711 (incorporated herein by reference in its entirety) which relates to adhesive compositions comprised of at least one terminally unsaturated vinyl monomer and at least one vinyl unsaturated, homopolymerizable emulsifier monomer resin dispersion. The compositions such as those in U.S. Pat. No. 4,645,711 also include a tackifier resin to increase the resisting lifting forces at elevated temperatures as well as the ability to cleanly remove the adhesive composition.

The adhesive materials of the invention can also be compounded with compounds that enhance the properties of the adhesive composition. Such additional compounds include, e.g., extenders, plasticizers, tackifiers, and other materials to provide specifically desired properties. The use of such additional compounds is known in the art. Examples of such materials and the their use are provided in numerous U.S. patents, including U.S. Pat. Nos. 3,085,903; 3,246,049; 3,356,635; 3,501,365; and 3,532,652 which are incorporated herein by reference in their entirety.

Another embodiment of the present invention comprises a method for removing particles from the edges of semiconductor wafers. In particular, the method comprises the steps of contacting the edge of at least one semiconductor wafer with a particle withdrawing means. The particle withdrawing means is contacted with the edges of the semiconductor wafers so that the particles are withdrawn from the wafers. The particle withdrawing means also inhibits the return of particles to the wafers. For this reason, the particle withdrawing means preferably comprises a pre-formed, low-tack adhesive material.

In a preferred embodiment of the invention, the method for removing particles from the edges of semiconductor wafers employs a particle withdrawing means which is essentially cylindrical in shape , e.g., a roller, cylinder, tube, spindle or the like. The axis 15 of the roller is preferably disposed perpendicular to the plane of the wafer so that the roller contacts the edges of the wafers.

In another embodiment of the invention, the particle withdrawing means is caused to contact the semiconductor wafers after-a photoresist has been applied to the wafers but prior to the photoprocessing of the photoresist material. The particle removal method of the present invention is especially useful at this point in the processing scheme because most cleaning techniques are severely limited at this stage, i.e., many cleaning techniques adversely affect the photoresist. For example, plasmas and acids cannot be used effectively at this stage of semiconductor processing because they tend to dissolve or destroy the photoresist material.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims, including the equivalents thereof.

What is claimed is:

1. An apparatus for removing particles from the edges of semiconductor wafers which comprises a particle withdrawing means contactable with the edge of at least one semiconductor wafer which removes particles from said wafer(s) and which inhibits the return of said particles to said wafer(s), wherein said particle withdrawing means comprises a pre-formed, low-tack adhesive material that is in contact with the edge(s) of the semiconductor wafer(s), wherein said particle withdrawing means comprises at least two removable layers of a composite sheet wherein each composite sheet comprises a substrate and a pre-formed, low-tack adhesive material that is bound to said substrate.

2. The apparatus according to claim 1, which further comprises a housing containing said particle withdrawing means.

3. The apparatus according to claim 1, wherein said particle withdrawing means is essentially cylindrical in shape and is rotatably contacted with said edge of said wafer.

4. The apparatus according to claim 3, wherein said particle withdrawing means is contactable with, and disposed in parallel to, the edges of at least two semiconductor wafers simultaneously.

5. The apparatus according to claim 1, wherein each layer of said composite sheet of pre-formed, low-tack adhesive material has a thickness no greater than about 10 mils.

6. The apparatus according to claim 5, wherein each layer of said composite sheet of pre-formed, low-tack adhesive material has a thickness no greater than about 1 mil.

7. The apparatus according to claim 6, wherein each layer of said composite sheet of pre-formed, low-tack adhesive material has a thickness no greater than about 0.1 mil.

8. The apparatus according to claim 1, wherein said composite sheet of pre-formed, low-tack adhesive material has a tensile strength of no less than about 500 psi.

9. The apparatus according to claim 8, wherein said composite sheet of pre-formed, low-tack adhesive material has a tensile strength of no less than about 2000 psi.

10. The apparatus according to claim 9, wherein said composite sheet of pre-formed, low-tack adhesive material has a tensile strength of no less than about 6000 psi.

11. The apparatus according to claim 1, wherein the substrate has an adhesion pull of from about 0.1 ounce to about 10 ounces per lineal inch.

12. The apparatus according to claim 11, wherein said substrate has an adhesion pull of from about 0.5 ounce to about 5 ounces per lineal inch.

13. The apparatus according to claim 1, wherein said pre-formed, low-tack adhesive material has sufficient tack to withdraw particles on the order of about 0.1 micron or smaller.

14. The apparatus according to claim 13, wherein said adhesive material has an adhesive strength of no greater than about 1000 grams per inch.

15. The apparatus according to claim 14, wherein said adhesive material has an adhesive strength of no greater than about 500 grams per inch.

16. The apparatus according to claim 15, wherein said adhesive material has an adhesive strength of no greater than about 100 grams per inch.

17. The apparatus according to claim 13, wherein said adhesive material has a tack of no greater than about 250 pounds per square inch.

18. The apparatus according to claim 17, wherein said adhesive material has a tack of no greater than about 100 pounds per square inch.

19. The apparatus according to claim 18, wherein said adhesive material has a tack of no greater than about 25 pounds per square inch.

20. The apparatus according to claim 13, wherein said adhesive material further comprises one or more compatible tackifier, plasticizer or extender components.

21. A method for removing particles from the edges of semiconductor wafers, comprising:

contacting the edge of at least one semiconductor wafer with a particle withdrawing means to remove particles from said wafer(s) and inhibit the return of said particles to said wafer(s) so as to cause a substantially unidirectional flow of particles away from said wafer(s), wherein said particle withdrawing means comprises a pre-formed, low-tack adhesive material that is directly in contact with the wafer(s) wherein said particle withdrawing means comprises at least two removable layers of a composite sheet wherein each composite sheet comprises a substrate and a pre-formed, low-tack adhesive material that is bound to said substrate.

22. The method according to claim 21, wherein said particle withdrawing means is caused to contact said wafer after applying a photoresist material and prior to the photoprocessing of said photoresist material.

* * * * *